US011562953B2

(12) United States Patent
Chen et al.

(10) Patent No.: US 11,562,953 B2
(45) Date of Patent: Jan. 24, 2023

(54) CELL HAVING STACKED PICK-UP REGION

(71) Applicant: TAIWAN SEMICONDUCTOR MANUFACTURING COMPANY LTD., Hsinchu (TW)

(72) Inventors: Chung-Hui Chen, Hsinchu (TW); Hao-Chieh Chan, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 16/660,363

(22) Filed: Oct. 22, 2019

(65) Prior Publication Data
US 2020/0126901 A1    Apr. 23, 2020

Related U.S. Application Data

(60) Provisional application No. 62/749,578, filed on Oct. 23, 2018.

(51) Int. Cl.
| H01L 23/528 | (2006.01) |
| H01L 23/50  | (2006.01) |
| H01L 23/522 | (2006.01) |
| G06F 30/39  | (2020.01) |
| H01L 21/8238| (2006.01) |

(52) U.S. Cl.
CPC .............. *H01L 23/50* (2013.01); *G06F 30/39* (2020.01); *H01L 21/823892* (2013.01); *H01L 23/5226* (2013.01); *H01L 23/5286* (2013.01)

(58) Field of Classification Search
CPC ............. H01L 23/50; H01L 21/823892; H01L 23/5286; H01L 27/11807; H01L 27/0207; H01L 27/0928
See application file for complete search history.

(56) References Cited

U.S. PATENT DOCUMENTS

| 5,895,940 | A  | * | 4/1999 | Kim ..................... H01L 27/0262 257/173 |
| 6,690,067 | B2 | * | 2/2004 | Ker ...................... H01L 27/0259 257/173 |
| 7,260,442 | B2 |   | 8/2007 | Hwang et al. |
| 8,232,625 | B2 | * | 7/2012 | Voldman ............. H01L 23/5227 257/621 |
| 9,256,709 | B2 |   | 2/2016 | Yu et al. |
| 9,780,082 | B2 | * | 10/2017| Lee ..................... H01L 27/0203 |
| 10,811,497| B2 | * | 10/2020| Kushner ............. H01L 29/0696 |
| 2005/0275032 | A1 | * | 12/2005 | Kodama ............. H01L 29/1079 257/355 |

(Continued)

*Primary Examiner* — Bitew A Dinke
(74) *Attorney, Agent, or Firm* — Hauptman Ham, LLP

(57) ABSTRACT

An integrated circuit includes two parallel active zones extending in a first direction, an n-type pick-up region, and a p-type pick-up region. The two parallel active zones includes a p-type active zone located in an n-type well and an n-type active zone located in a p-type well. The n-type pick-up region is located in the n-type well and configured to have a first supply voltage. The p-type pick-up region is located in the p-type well and configured to have a second supply voltage, wherein the second supply voltage is lower than the first supply voltage. The n-type pick-up region and the p-type pick-up region are separated from each other along a direction that is different from the first direction.

20 Claims, 11 Drawing Sheets

(56) References Cited

U.S. PATENT DOCUMENTS

| | | | |
|---|---|---|---|
| 2006/0151836 A1* | 7/2006 | Salcedo | H01L 29/7436 |
| | | | 257/362 |
| 2007/0007545 A1* | 1/2007 | Salcedo | H01L 29/87 |
| | | | 257/127 |
| 2007/0033548 A1* | 2/2007 | Tatsumi | H01L 27/11898 |
| | | | 257/371 |
| 2007/0096154 A1* | 5/2007 | Shimbo | H01L 27/11807 |
| | | | 257/207 |
| 2009/0315079 A1* | 12/2009 | Tien | H01L 27/0207 |
| | | | 257/207 |
| 2010/0155783 A1* | 6/2010 | Law | H01L 27/0207 |
| | | | 257/206 |
| 2010/0244187 A1* | 9/2010 | Voldman | H01L 23/60 |
| | | | 257/531 |
| 2012/0081150 A1* | 4/2012 | Pelloie | G06F 30/39 |
| | | | 326/101 |
| 2014/0001563 A1* | 1/2014 | Rashed | H01L 27/0207 |
| | | | 257/369 |
| 2014/0040838 A1 | 2/2014 | Liu et al. | |
| 2014/0183647 A1* | 7/2014 | Lu | H01L 27/092 |
| | | | 257/369 |
| 2014/0291765 A1* | 10/2014 | Ouyang | H01L 27/0277 |
| | | | 257/355 |
| 2015/0278429 A1 | 10/2015 | Chang | |
| 2016/0078164 A1* | 3/2016 | Hsieh | H01L 27/0207 |
| | | | 716/55 |
| 2016/0268243 A1* | 9/2016 | Lee | H01L 27/092 |
| 2017/0092638 A1* | 3/2017 | Jung | H01L 23/528 |
| 2017/0194487 A1* | 7/2017 | Chen | H01L 29/0869 |
| 2017/0229457 A1* | 8/2017 | Maeno | H01L 27/0738 |
| 2017/0317027 A1* | 11/2017 | Chen | H01L 21/823431 |

* cited by examiner

US 11,562,953 B2

CELL HAVING STACKED PICK-UP REGION

PRIORITY CLAIM

The present application claims the priority of U.S. Provisional Application No. 62/749,578, filed Oct. 23, 2018, which is incorporated herein by reference in its entirety.

BACKGROUND

Some integrated circuits (ICs) are designed using, and manufactured based on, various cells including digital cells and analog cells. As the transistors in integrated circuits become smaller in physical size and more densely placed, more design consideration needs to be placed upon latchup. Latchup causes undesirable short circuits. Some integrated circuits (ICs) use tap cells to couple n-type wells to a first supply voltage VDD and to couple p-type wells or p-type substrates to a second supply voltage VSS. Tap cells having same height as standard cells between the power rails occupy valuable area in layout designs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
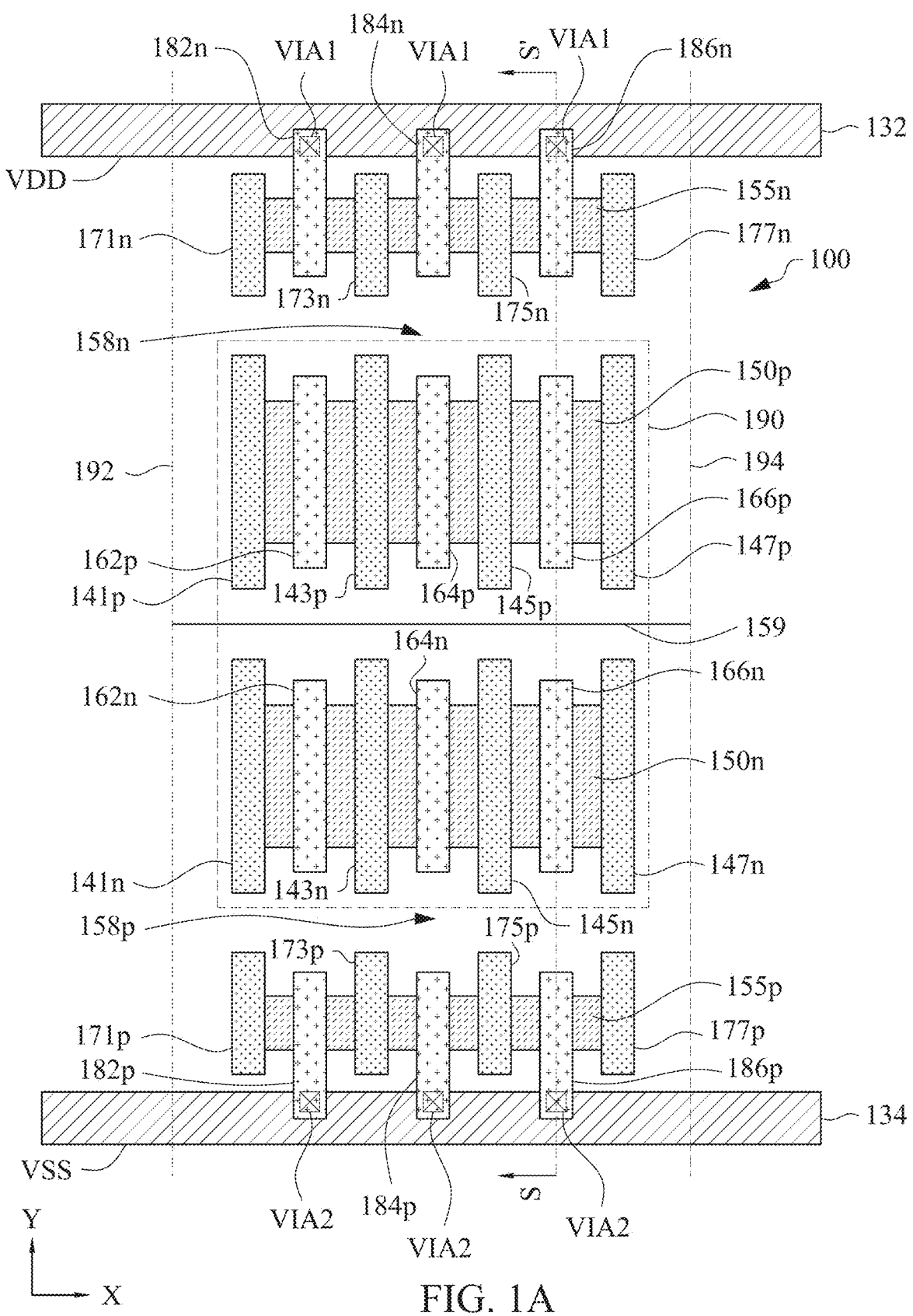
FIG. 1A is a schematic diagram of a cell having stacked pick-up regions, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some layouts of integrated circuits, cells with similar height are positioned between two vertically separated power rails. Cell height is measured in a Y-direction in a plan view of a layout. One of the power rails provides the first supply voltage VDD to the cells and another one of the power rails provides the second supply voltage VSS to the cells, in some embodiments. Additionally, tap cells horizontally adjoining standard cells are positioned at the sides of the standard digital cells, which are between the two vertically separated power rails, to couple the n-type wells in the standard digital cells to the first supply voltage VDD and to couple the p-type wells in the standard digital cells to the second supply voltage VSS. In some integrated circuits, however, the layouts also include cells with variable heights that are multiples of a minimum cell height. For example, some cells with analog circuits have heights that are two times the minimum cell height, and some analog cells have heights that are three times the minimum cell height. In some cells which have cell heights larger than the minimum cell height, there are wasted areas and increased metal connections that increase RC delays. In some layout designs, it is advantageous to position one or more pick-up regions directly in a cell which has a height higher than the minimum cell height. A pick-up region is a region that conductively connects a particular dopant type well in the cell to a voltage source. In some embodiments, an n-type pick-up region is used to conductively connect the n-type well in the cell to the first supply voltage VDD, and a p-type pick-up region is used to conductively connect the p-type well in the cell to the second supply voltage VSS. The n-type dopant concentration of the pick-up region for the n-type well is higher than the n-type dopant concentration of the n-type well. The p-type dopant concentration of the pick-up region for the p-type well is higher than the p-type dopant concentration of the p-type well. In some embodiments, pick-up regions are implemented in a cell to prevent undesirable short circuits caused by latchup.

FIG. 1A is a schematic diagram of a cell 100 having stacked pick-up regions, in accordance with some embodiments. In FIG. 1A, the cell 100 is between two parallel power rails (e.g., 132 and 134) extending in the X-direction and bounded by two parallel cell boundaries (e.g., 192 and 194) extending in the Y-direction that is perpendicular to the X-direction. The power rail 132 is configured to have a first supply voltage VDD, and the power rail 134 is configured to have a second supply voltage VSS. In some embodiments, the first supply voltage VDD on the power rail 132 is higher than the second supply voltage VSS on the power rail 134. The cell 100 includes a p-type active zone 150p and an n-type active zone 150n extending in the X-direction. The p-type active zone 150p is in an n-type well 158n (best seen in FIG. 1B), and the n-type active zone 150n is in a p-type well 158p (best seen in FIG. 1B). The n-type well 158n and the p-type well 158p are separated by a well boundary 159. The n-type well 158n occupies the entirety of the area bounded by the cell boundary 192, the well boundary 159, the cell boundaries 194, and the power rail 132. The p-type well 158p occupies the entirety of the area bounded by the cell boundary 192, the well boundary 159, the cell boundaries 194, and the power rail 134. In some embodiments, one or both of the wells (i.e., the n-type well 158n and/or the p-type well 158) cross over at least one of the cell boundaries (e.g., 192 or 194) and occupy an area that extends from one side of a cell boundary to another side of the cell boundary. In some embodiments, the n-type well 158n extends from one side of the power rail 132 to another side of the power rail 132. In some embodiments, the p-type well 158p extends from one side of the power rail 134 to another side of the power rail 134.

The cell 100 includes an n-type pick-up region 155n in the n-type well 158n and a p-type pick-up region 155p in the p-type well 158p. The n-type pick-up region 155n and the p-type pick-up region 155p are separated from each other in the Y-direction. The n-type pick-up region 155n is configured to couple the n-type well 158n to the first supply voltage VDD. The p-type pick-up region 155p is configured to couple the p-type well 158p to the second supply voltage VSS. In some embodiments, the n-type pick-up region and/or the p-type pick-up region are in geometric shapes that extend in the X-direction. For example, in some embodiments, each of the n-type pick-up region and the p-type pick-up region has a width extending in the X-direction and has a height extending in the Y-direction, in a geometric configuration that the height is less than 25% of the width.

In some embodiments, the cell 100 includes one or more conductive segments (e.g., 182n, 184n, and 186n) extending in the Y-direction and over the n-type pick-up region 155n. The cell 100 includes one or more conductive segments (e.g., 182p, 184p, and 186p) extending in the Y-direction and over the p-type pick-up region 155p. In some embodiments, the conductive segments (e.g., 182n, 184n, and 186n) over the n-type pick-up region 155n conductively connect the n-type pick-up region 155n to the power rail 132, and the conductive segments (e.g., 182p, 184p, and 186p) over the p-type pick-up region 155p conductively connect the p-type pick-up region 155p to the power rail 134.

In some embodiments, each of the conductive segments (e.g., 182n, 184n, and 186n) over the n-type pick-up region 155n forms a conductive contact with the n-type pick-up region 155n, and each of the conductive segments (e.g., 182p, 184p, and 186p) over the p-type pick-up region 155p forms a conductive contact with the p-type pick-up region 155p. In some embodiments, each of the conductive segments (e.g., 182n, 184n, and 186n) over the n-type pick-up region 155n is conductively connected to the power rail 132 through one or more via connections VIA1, and each of the conductive segments (e.g., 182p, 184p, and 186p) over the p-type pick-up region 155p is conductively connected to the power rail 134 through one or more via connections VIA2.

In some embodiments, the cell 100 includes gate-strips (e.g., 171n, 173n, 175n, and 177n) extending in the Y-direction and intersecting the n-type pick-up region 155n. In some embodiments, the cell 100 includes gate-strips (e.g., 171p, 173p, 175p, and 177p) extending in the Y-direction and intersecting the p-type pick-up region 155p. In some embodiments, one or more of the gate-strips over the n-type pick-up region 155n or over the p-type pick-up region 155p are dummy gates. In some embodiments, one or more of the gate-strips over the n-type pick-up region 155n are active gates of transistors, and in some embodiments, one or more of the gate-strips over the p-type pick-up region 155p are active gates of transistors. In FIG. 1A, the gate-strips (e.g., 171n, 173n, 175n, and 177n) intersecting the n-type pick-up region 155n are floating without connecting to a power rail (e.g., 132); the gate-strips (e.g., 171p, 173p, 175p, and 177p) intersecting the p-type pick-up region 155p are floating without connecting to a power rail (e.g., 134). In some alternative embodiments, one or more of the gate-strips (e.g., 171n, 173n, 175n, and 177n) intersecting the n-type pick-up region 155n are conductively connected to the power rail 132. In some embodiments, one or more of the gate-strips (e.g., 171p, 173p, 175p, and 177p) intersecting the p-type pick-up region 155p are conductively connected to the power rail 134.

In FIG. 1A, the cell 100 includes a circuit 190 having transistors in the p-type active zone 150p and transistors in the n-type active zone 150n. In some embodiments, the cell 100 is an analog cell constructed based on the circuit 290. The analog cell includes at least one output signal having an analog value that is a continuous function of an analog value of an input signal of the analog cell. In contrast, the value of each output signal of a digital cell generally is a discrete function of the digital values of one or more digitized input signals. The transistors in the p-type active zone 150p have channel regions formed under the gate-strips (e.g., 141p, 143p, 145p, and 147p) intersecting the p-type active zone 150p, and in some embodiments, the gate-strips 141p and 147p are dummy gates. The transistors in the n-type active zone 150n have channel regions formed under the gate-strips (e.g., 141n, 143n, 145n, and 147n) intersecting the n-type active zone 150n, and in some embodiments, the gate-strips 141n and 147n are dummy gates. Each of the transistors in the p-type active zone 150p has a source or a drain conductively connected to one of the conductive segments (e.g., 162p, 164p, and 166p) intersecting the p-type active zone 150p, and each of the transistors in the n-type active zone 150n has a source or a drain conductively connected to one of the conductive segments (e.g., 162n, 164n, and 166n) intersecting the n-type active zone 150n. In the circuit 190, the transistors in the p-type active zone 150p and the transistors in the n-type active zone 150n are connected to various electronic components by conductive connections in one or more routing metal layers. In some embodiments, the one or more routing metal layers are above the interlayer dielectric layer that covers the gate-strips and the conductive segments intersecting the p-type active zone 150p or the n-type active zone 150n.

Figure 1B:
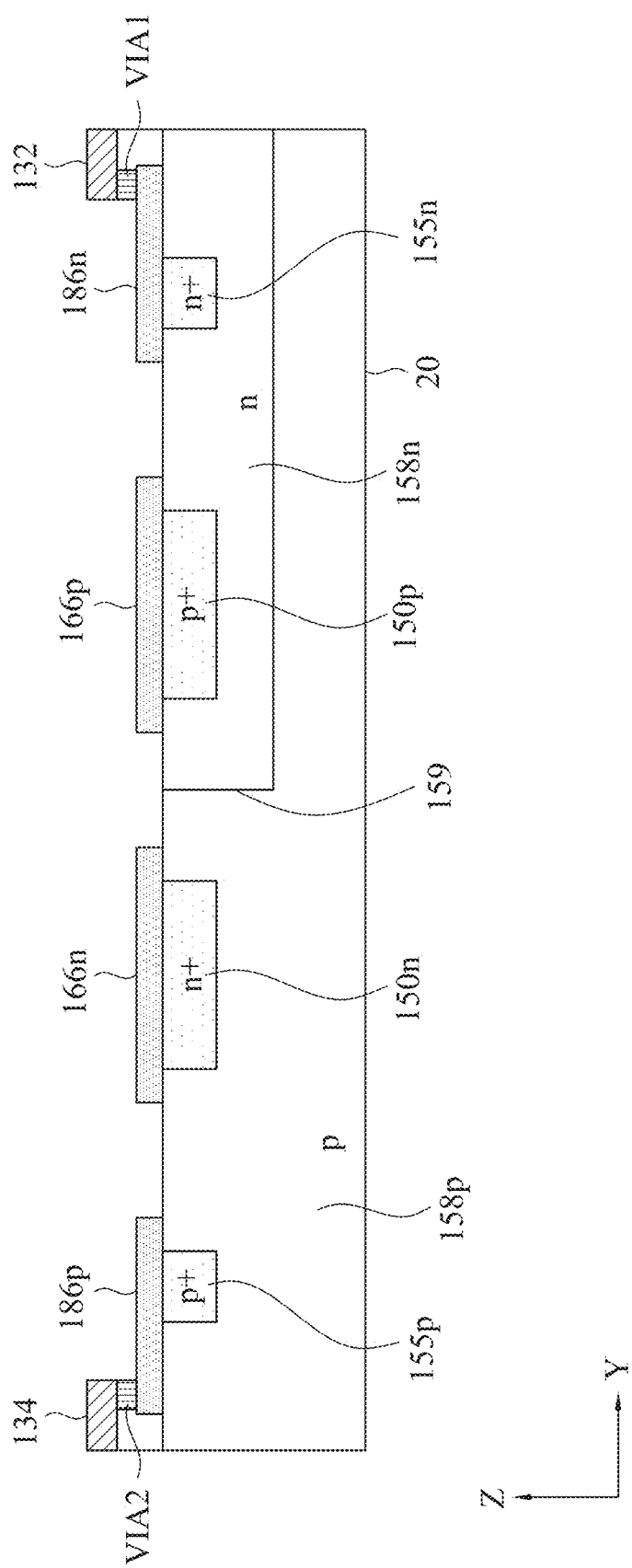
FIG. 1B is a cross-sectional view of the cell along a cut-off plan S-S' in FIG. 1A, in accordance with some embodiments.

FIG. 1B is a cross-sectional view of the cell 100 along a cut-off plan S-S' in FIG. 1A, in accordance with some embodiments. In FIG. 1B, the n-type well 158n is implemented in a p-type substrate 20, the p-type well 158p is provided by a portion of the p-type substrate 20. In some embodiments, as shown in FIG. 1B, the p-type active zone 150p and the n-type active zone 150n, in regions near the cut-off plan S-S', are correspondingly provided by p+ diffusion and n+ diffusion. In some embodiments, the n-type pick-up region 155n for an upper power pick-up and the p-type pick-up region 155p for a lower power pick-up, in regions near the cut-off plan S-S', are correspondingly provided by n+ diffusion and p+ diffusion. The n-type carrier density in the n-type pick-up region 155n is higher than the n-type carrier density in the n-type well 158n, and a p-type carrier density in the p-type pick-up region 155p is higher than the p-type carrier density in the p-type well 158p. The well boundary 159 as shown in FIG. 1A and FIG. 1B separates the n-type well 158n from the p-type well 158p.

In FIG. 1B, the conductive segments 166p and 166n are correspondingly over the p-type active zone 150p and the n-type active zone 150n; the conductive segments 186n and 186p are correspondingly over the n-type pick-up region 155n and the p-type pick-up region 155p. The n-type pick-up region 155n is conductively connected to the power rail 132 through a via connection VIA1, and the p-type pick-up region 155p is conductively connected to the power rail 134 through a via connection VIA2. In operation, when the power rail 132 is held at the first supply voltage VDD and the power rail 134 is held at the second supply voltage VSS, the n-type pick-up region 155n and the p-type pick-up region 155p are correspondingly held at the first supply voltage VDD and the second supply voltage VSS. Consequently, the n-type well 158n surrounding the p-type active zone 150p is maintained at the first supply voltage VDD, and the p-type well 158p surrounding the n-type active zone 150n is maintained at the second supply voltage VSS. During normal operation, because the voltage in the p-type active zone 150p is lower than the first supply voltage VDD at the n-type well 158n, leakage currents will not be caused by forward-biased pn junctions between the p-type active zone 150p and the n-type well 158n, and latch-up involving the p-type active zone 150p is prevented. During normal operation, because the voltage in the n-type active zone 150n is higher than the second supply voltage VSS at the p-type well 158p, leakage currents will not be caused by forward-biased pn junctions between the n-type active zone 150n and the p-type well 158p, and latch-up involving the n-type active zone 150n is prevented.

Figure 2:
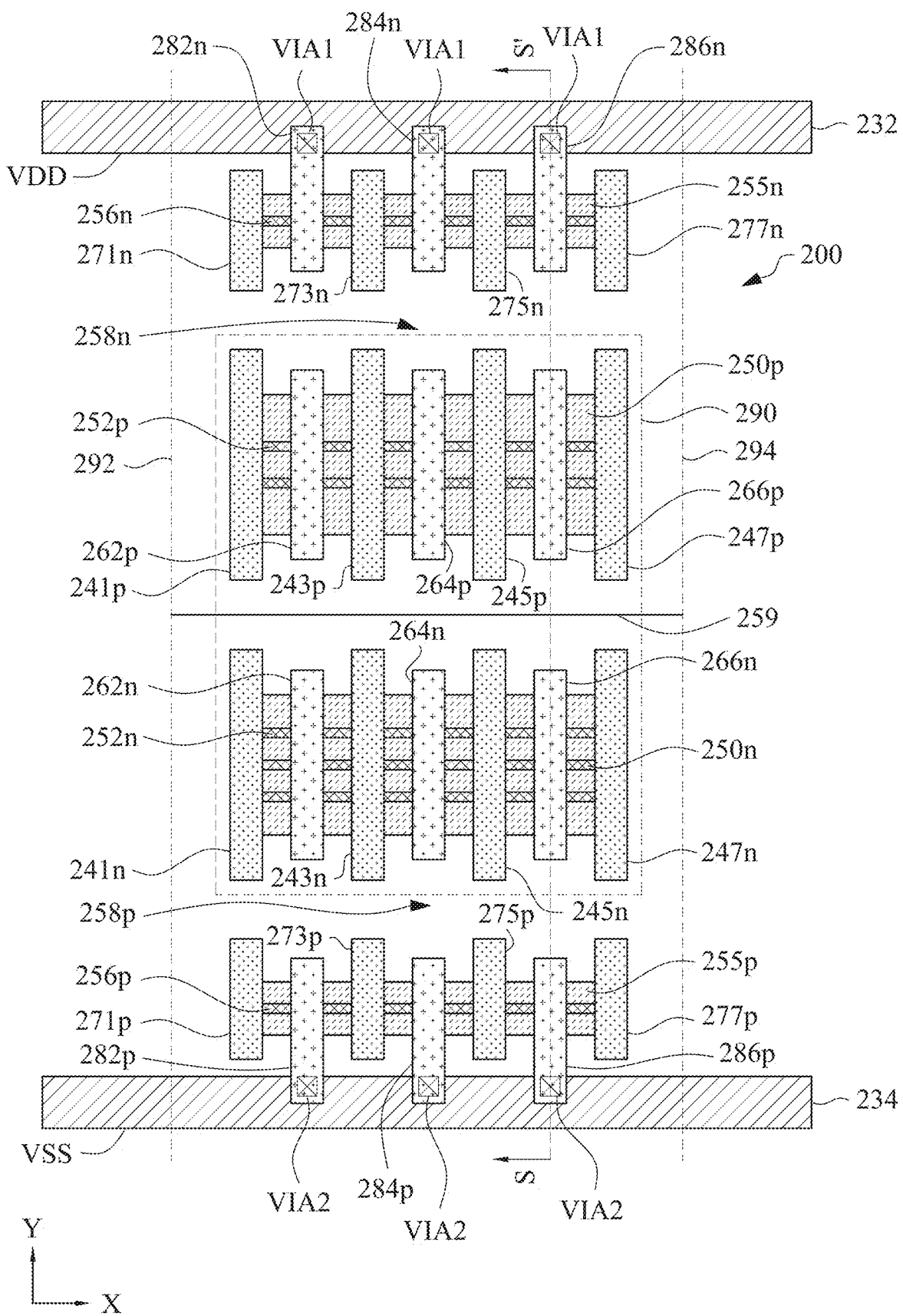
FIG. 2 is a schematic diagram of a cell having stacked pick-up regions and fin transistors, in accordance with some embodiments.

FIG. 2 is a schematic diagram of a cell 200 having stacked pick-up regions and fin transistors, in accordance with some embodiments. In FIG. 2, the cell 200 is between two parallel power rails (e.g., 232 and 234) extending in the X-direction and bounded by two parallel cell boundaries (e.g., 292 and 294) extending in the Y-direction. The power rail 232 is configured to have a first supply voltage VDD, and the power rail 234 is configured to have a second supply voltage VSS. The first supply voltage VDD on the power rail 232 is higher than the second supply voltage VSS on the power rail 234. The cell 200 includes a p-type active zone 250p and an n-type active zone 250n extending in the X-direction. The p-type active zone 250p is in an n-type well 258n, and the n-type active zone 250n is in a p-type well 258p. The n-type well 258n and the p-type well 258p are separated by a well boundary 259. The n-type well 258n occupies at least the area bounded by the cell boundary 292, the well boundary 259, the cell boundaries 294, and the power rail 232. The p-type well 258p occupies at least the area bounded by the cell boundary 292, the well boundary 259, the cell boundaries 294, and the power rail 234.

The cell 200 includes an n-type pick-up region 255n in the n-type well 258n and a p-type pick-up region 255p in the p-type well 258p. The n-type pick-up region 255n is configured to couple the n-type well 258n to the first supply voltage VDD. The p-type pick-up region 255p is configured to couple the p-type well 258p to the second supply voltage VSS.

In FIG. 2, the cell 200 includes one or more conductive segments (e.g., 282n, 284n, and 286n) over the n-type pick-up region 255n, and in some embodiments, the cell 200 includes one or more conductive segments (e.g., 282p, 284p, and 286p) over the p-type pick-up region 255p. In some embodiments, one or more n-type fin structures 256n are formed in the n-type pick-up region 255n, and in some embodiments, one or more p-type fin structures 256p are formed in the p-type pick-up region 255p. In some embodiments, one or more conductive segments (e.g., 282n, 284n, and 286n) over the n-type pick-up region 255n are conductively connected to the n-type pick-up region 255n through the one or more n-type fin structures 256n, and in some embodiments, one or more conductive segments (e.g., 282p, 284p, and 286p) over the p-type pick-up region 255p are conductively connected to the p-type pick-up region 255p through the one or more p-type fin structures 256p. In some embodiments, one or more conductive segments (e.g., 282n, 284n, and 286n) over the n-type pick-up region 255n are conductively connected to the power rail 232 through one or more via connections VIA1, and in some embodiments, and one or more conductive segments (e.g., 282p, 284p, and 286p) over the p-type pick-up region 255p are conductively connected to the power rail 234 through one or more via connections VIA2.

In some embodiments, the cell 200 includes gate-strips (e.g., 271n, 273n, 275n, and 277n) extending in the Y-direction and intersecting the n-type pick-up region 255n. In some embodiments, the cell 200 includes gate-strips (e.g., 271p, 273p, 275p, and 277p) extending in the Y-direction and intersecting the p-type pick-up region 255p. In some embodiments, one or more of the gate-strips over the n-type pick-up region 255n or over the p-type pick-up region 255p are dummy gates. In some embodiments, one or more of the gate-strips over the n-type pick-up region 255n are active gates of transistors, and in some embodiments, one or more of the gate-strips over the p-type pick-up region 255p are active gates of transistors. In FIG. 2, the gate-strips (e.g., 271n, 273n, 275n, and 277n) intersecting the n-type pick-up region 255n are floating without connecting to a power rail (e.g., 232), and in some embodiments, the gate-strips (e.g., 271p, 273p, 275p, and 277p) intersecting the p-type pick-up region 255p are floating without connecting to a power rail (e.g., 234). In some alternative embodiments, one or more of the gate-strips (e.g., 271n, 273n, 275n, and 277n) intersecting the n-type pick-up region 255n are conductively connected to the power rail 232. In some embodiments, one or more of the gate-strips (e.g., 271p, 273p, 275p, and 277p) intersecting the p-type pick-up region 255p are conductively connected to the power rail 234.

In FIG. 2, the cell 200 includes a p-type active zone 250p extending in the X-direction and an n-type active zone 250n extending in the Y-direction. In some embodiments, one or more p-type fin structures 252p are formed in the p-type active zone 250p, and in some embodiments, one or more n-type fin structures 252n are formed in the n-type active zone 250n. In some embodiments, the number of p-type fin structures 252p in the p-type active zone 250p is equal to the number of n-type fin structures 252n in the n-type active zone 250n. For example, two p-type fin structures 252p are in the p-type active zone 250p and two n-type fin structures 252n are in the n-type active zone 250n. In some embodiments, the number of p-type fin structures 252p in the p-type active zone 250p is different from the number of n-type fin structures 252n in the n-type active zone 250n. For example, as shown in FIG. 2, two p-type fin structures 252p are in the p-type active zone 250p, but three n-type fin structures 252n are in the n-type active zone 250n.

In FIG. 2, the cell 200 includes a circuit 290 having fin transistors in the p-type active zone 250p and fin transistors in the n-type active zone 250n. In some embodiments, the cell 200 is an analog cell constructed based on the circuit 290. In some embodiments, the fin transistors in the p-type active zone 250p have channel regions formed under the gate-strips (e.g., 241p, 243p, 245p, and 247p) intersecting the p-type fin structures 252p, and in some embodiments, the gate-strips 241p and 247p are dummy gates. In some embodiments, the fin transistors in the n-type active zone 250n have channel regions formed under the gate-strips (e.g., 241n, 243n, 245n, and 247n) intersecting the n-type fin structures 252n, and in some embodiments, the gate-strips 241n and 247n are dummy gates. In some embodiments, each of the fin transistors in the p-type active zone 250p has a source or a drain conductively connected to one of the conductive segments (e.g., 262p, 264p, and 266p) intersecting the p-type fin structures 252p and each of the fin transistors in the n-type active zone 250n has a source or a drain conductively connected to one of the conductive segments (e.g., 262n, 264n, and 266n) intersecting the n-type fin structures 252n. In the circuit 290, the fin transistors in the p-type active zone 250p and the fin transistors in the n-type active zone 250n are connected to various electronic components by conductive connections in one or more routing metal layers.

Figure 3A:
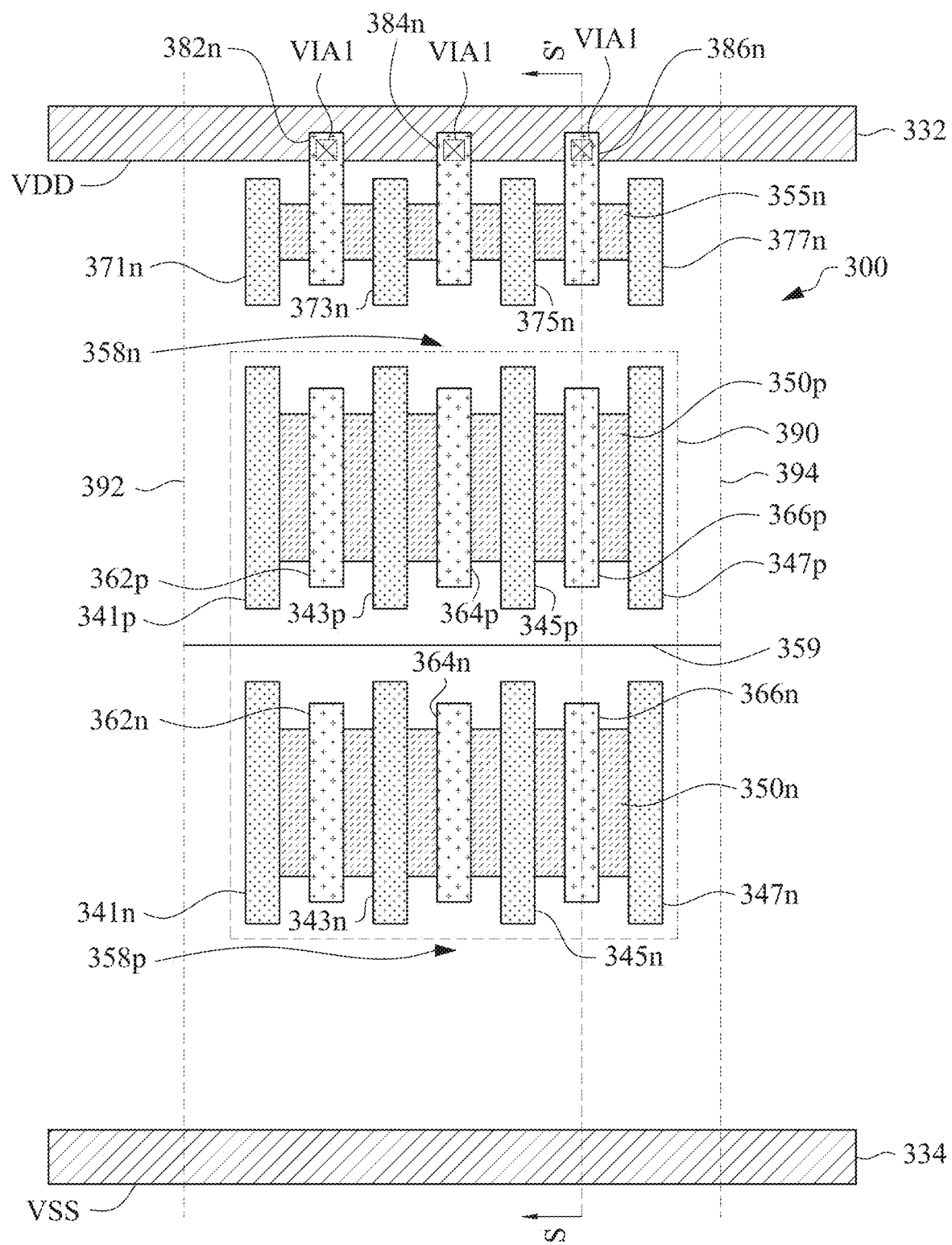
FIG. 3A is a schematic diagram of a cell having one stacked pick-up region in the n-type well, in accordance with some embodiments.

FIG. 3A is a schematic diagram of a cell 300 having one stacked pick-up region in the n-type well, in accordance with some embodiments. In FIG. 3A, the cell 300 is between two parallel power rails (e.g., 332 and 334) extending in the X-direction and bounded by two parallel cell boundaries (e.g., 392 and 394) extending in the Y-direction. The power rail 332 is configured to have a first supply voltage VDD, and the power rail 334 is configured to have a second supply voltage VSS. The first supply voltage VDD on the power rail 332 is higher than the second supply voltage VSS on the power rail 334. The cell 300 includes a p-type active zone 350p and an n-type active zone 350n extending in the X-direction. The p-type active zone 350p is in an n-type well 358n, and the n-type active zone 350n is in a p-type well 358p. The n-type well 358n and the p-type well 358p are separated by a well boundary 359. The n-type well 358n occupies at least the area bounded by the cell boundary 392, the well boundary 359, the cell boundaries 394, and the power rail 332. The p-type well 358p occupies at least the area bounded by the cell boundary 392, the well boundary 359, the cell boundaries 394, and the power rail 334.

The cell 300 includes an n-type pick-up region 355n in the n-type well 358n, which is configured to couple the n-type well 358n to the first supply voltage VDD. In some embodiments, the cell 300 includes one or more conductive segments (e.g., 382n, 384n, and 386n) extending in the Y-direction and over the n-type pick-up region 355n. One or more of the conductive segments (e.g., 382n, 384n, and 386n) over the n-type pick-up region 355n conductively connect the n-type pick-up region 355n to the power rail 332 through one or more via connections VIA1 In FIG. 3A, one or more of the gate-strips (e.g., 371n, 373n, 375n, and 377n) intersecting the n-type pick-up region 355n are floating without connecting to a power rail (e.g., 332). In some alternative embodiments, the cell 300 includes gate-strips (e.g., 371n, 373n, 375n, and 377n) intersecting the n-type pick-up region 355n.

In FIG. 3A, the cell 300 includes a circuit 390 having transistors in the p-type active zone 350p and transistors in the n-type active zone 350n. In some embodiments, the cell 300 is an analog cell constructed based on the circuit 390. In some embodiments, the transistors in the p-type active zone 350p have channel regions formed under the gate-strips (e.g., 341p, 343p, 345p, and 347p) intersecting the p-type active zone 350p, and in some embodiments, the gate-strips 341p and 347p are dummy gates. In some embodiments, the transistors in the n-type active zone 350n have channel regions formed under the gate-strips (e.g., 341n, 343n, 345n, and 347n) intersecting the n-type active zone 350n, and in some embodiments, the gate-strips 341n and 347n are dummy gates. In some embodiments, each of the transistors in the p-type active zone 350p has a source or a drain conductively connected to one of the conductive segments (e.g., 362p, 364p, and 366p) intersecting the p-type active zone 350p, and each of the transistors in the n-type active zone 350n has a source or a drain conductively connected to one of the conductive segments (e.g., 362n, 364n, and 366n) intersecting the n-type active zone 350n. In the circuit 390, the transistors in the p-type active zone 350p and the transistors in the n-type active zone 350n are connected to various electronic components by conductive connections in one or more routing metal layers overlying both the conductive segments (e.g., 362p, 364p, and 366p) intersecting the p-type active zone 350p and the conductive segments (e.g., 362n, 364n, and 366n) intersecting the n-type active zone 350n.

Figure 3B:
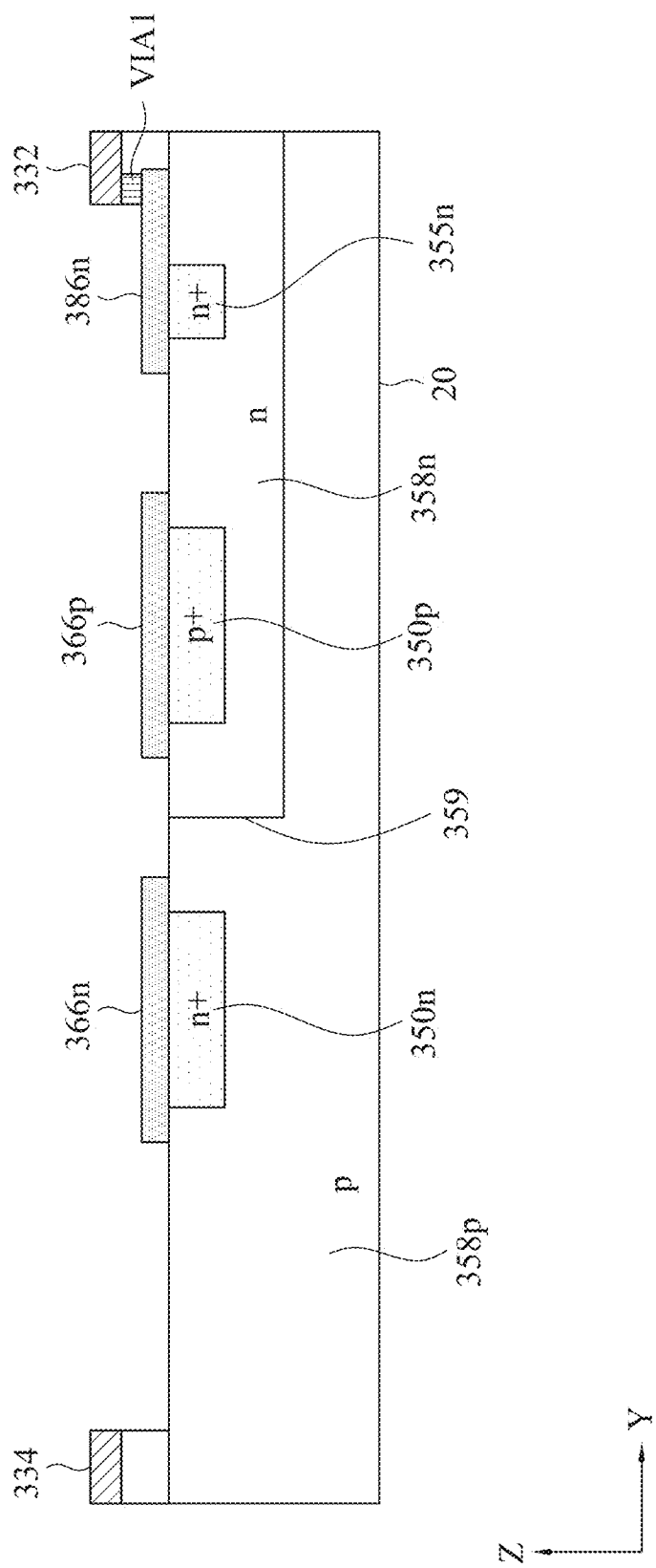
FIG. 3B is a cross-sectional view of the cell along a cut-off plan S-S' in FIG. 3A, in accordance with some embodiments.

FIG. 3B is a cross-sectional view of the cell 300 along a cut-off plan S-S' in FIG. 3A, in accordance with some embodiments. In FIG. 3B, the n-type well 358n is implemented in a p-type substrate 20, the p-type well 358p is provided by a portion of the p-type substrate 20. In FIG. 3B, the p-type active zone 350p and the n-type active zone 350n, in regions near the cut-off plan S-S', are correspondingly provide by p+ diffusion and n+ diffusion. The n-type pick-up region 355n for the upper power pick-up is provide by n+ diffusion. The n-type carrier density in the n-type pick-up region 355n is higher than the n-type carrier density in the n-type well 358n. The well boundary 359 separates the n-type well 358n from the p-type well 358p. In FIG. 3B, the n-type pick-up region 355n is conductively connected to the power rail 332 through a via connection VIA1 In operation, because the n-type pick-up region 355n is maintained at the first supply voltage VDD provided by the power rail 332, the n-type well 358n surrounding the p-type active zone 350p is maintained at the first supply voltage VDD. During normal operation, because the voltage in the p-type active zone 350p is lower than the first supply voltage VDD at the n-type well 358n, leakage currents will not be caused by forward-biased pn junctions between the p-type active zone 350p and the n-type well 358n, and latch-up involving the p-type active zone 350p is prevented.

Figure 4A:
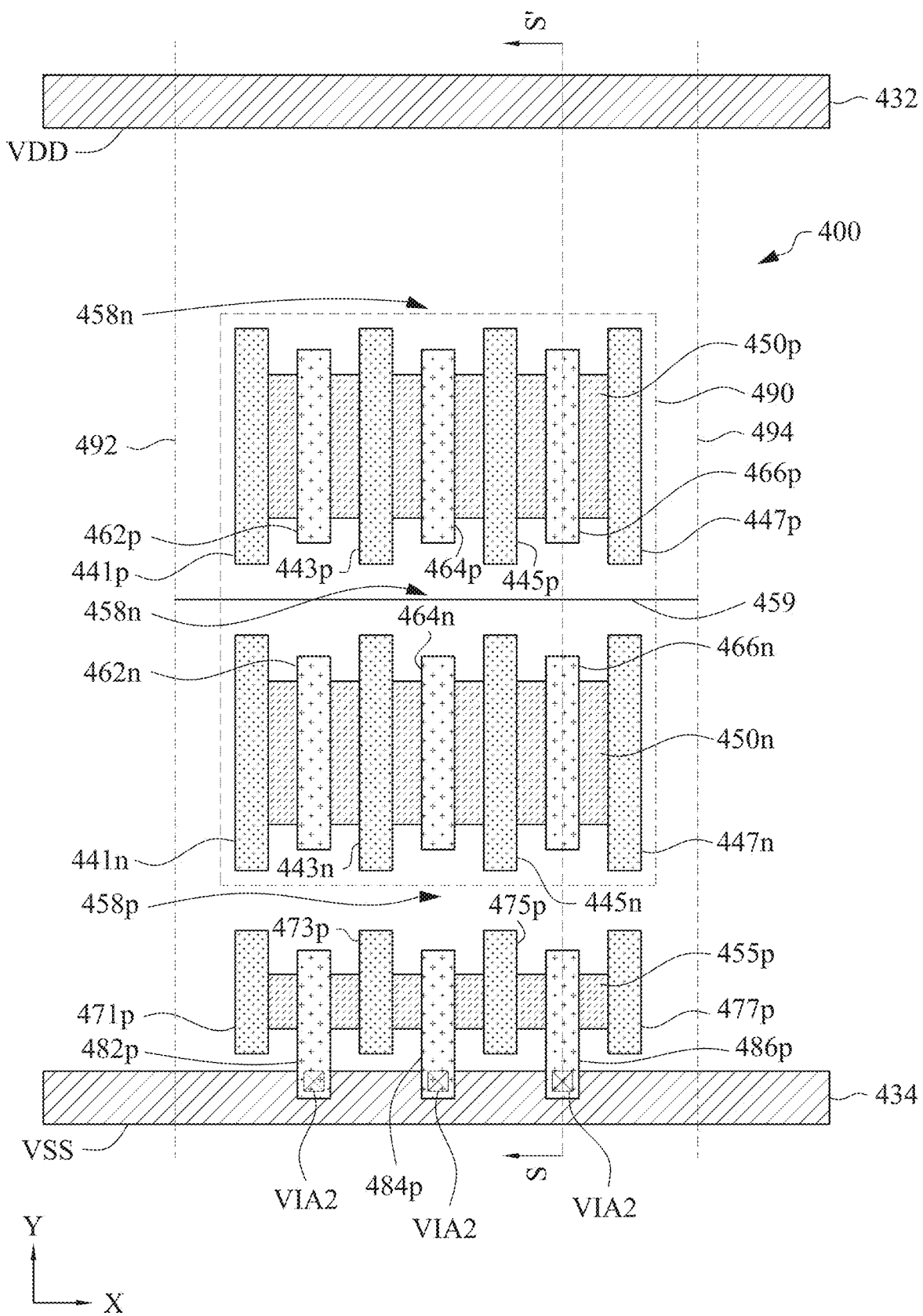
FIG. 4A is a schematic diagram of a cell having one stacked pick-up region in the p-type well, in accordance with some embodiments.

FIG. 4A is a schematic diagram of a cell 400 having one stacked pick-up region in the p-type well, in accordance with some embodiments. In FIG. 4A, the cell 400 is between two parallel power rails (e.g., 432 and 434) extending in the X-direction and bounded by two parallel cell boundaries (e.g., 492 and 494) extending in the Y-direction. The power rail 432 is configured to have a first supply voltage VDD, and the power rail 434 is configured to have a second supply voltage VSS. The first supply voltage VDD on the power rail 432 is higher than the second supply voltage VSS on the power rail 434. The cell 400 includes a p-type active zone 450p and an n-type active zone 450n extending in the X-direction. The p-type active zone 450p is in an n-type well 458n, and the n-type active zone 450n is in a p-type well 458p. The n-type well 458n and the p-type well 458p are separated by a well boundary 459. The n-type well 458n occupies at least the area bounded by the cell boundary 492, the well boundary 459, the cell boundaries 494, and the power rail 432. The p-type well 458p occupies at least the area bounded by the cell boundary 492, the well boundary 459, the cell boundaries 494, and the power rail 434.

The cell 400 includes a p-type pick-up region 455p in the p-type well 458p, which is configured to couple the p-type well 458p to the second supply voltage VSS. The cell 400 includes one or more conductive segments (e.g., 482p, 484p, and 486p) extending in the Y-direction and over the p-type pick-up region 455p. One or more of the conductive segments (e.g., 482p, 484p, and 486p) over the p-type pick-up region 455p conductively connect the p-type pick-up region 455p with the power rail 434 through one or more via connections VIA2. The cell 400 includes gate-strips (e.g., 471p, 473p, 475p, and 477p) intersecting the p-type pick-up region 455p. One or more of the gate-strips (e.g., 471p, 473p, 475p, and 477p) intersecting the p-type pick-up region 455p are floating without connecting to a power rail (e.g., 434). In some alternative embodiments, one or more of the gate-strips (e.g., 471p, 473p, 475p, and 477p) intersecting the p-type pick-up region 455p are conductively connected to the power rail 434.

In FIG. 4A, the cell 400 includes a circuit 490 having transistors in the p-type active zone 450p and transistors in the n-type active zone 450n. In some embodiments, the cell 400 is an analog cell constructed based on the circuit 490. In some embodiments, the transistors in the p-type active zone 450p have channel regions formed under the gate-strips (e.g., 441p, 443p, 445p, and 447p) intersecting the p-type active zone 450p, and in some embodiments, the gate-strips 441p and 447p are dummy gates. In some embodiments, the transistors in the n-type active zone 450n have channel regions formed under the gate-strips (e.g., 441n, 443n, 445n, and 447n) intersecting the n-type active zone 450n, and in some embodiments, the gate-strips 441n and 447n are dummy gates. In some embodiments, each of the transistors in the p-type active zone 450p has a source or a drain conductively connected to one of the conductive segments (e.g., 462p, 464p, and 466p) intersecting the p-type active zone 450p, and each of the transistors in the n-type active zone 450n has a source or a drain conductively connected to one of the conductive segments (e.g., 462n, 464n, and 466n) intersecting the n-type active zone 450n. In the circuit 490, the transistors in the p-type active zone 450p and the transistors in the n-type active zone 450n are connected to various electronic components by conductive connections in one or more routing metal layers overlying both the conductive segments (e.g., 462p, 464p, and 466p) intersecting the p-type active zone 450p and the conductive segments (e.g., 462n, 464n, and 466n) intersecting the n-type active zone 450n.

Figure 4B:
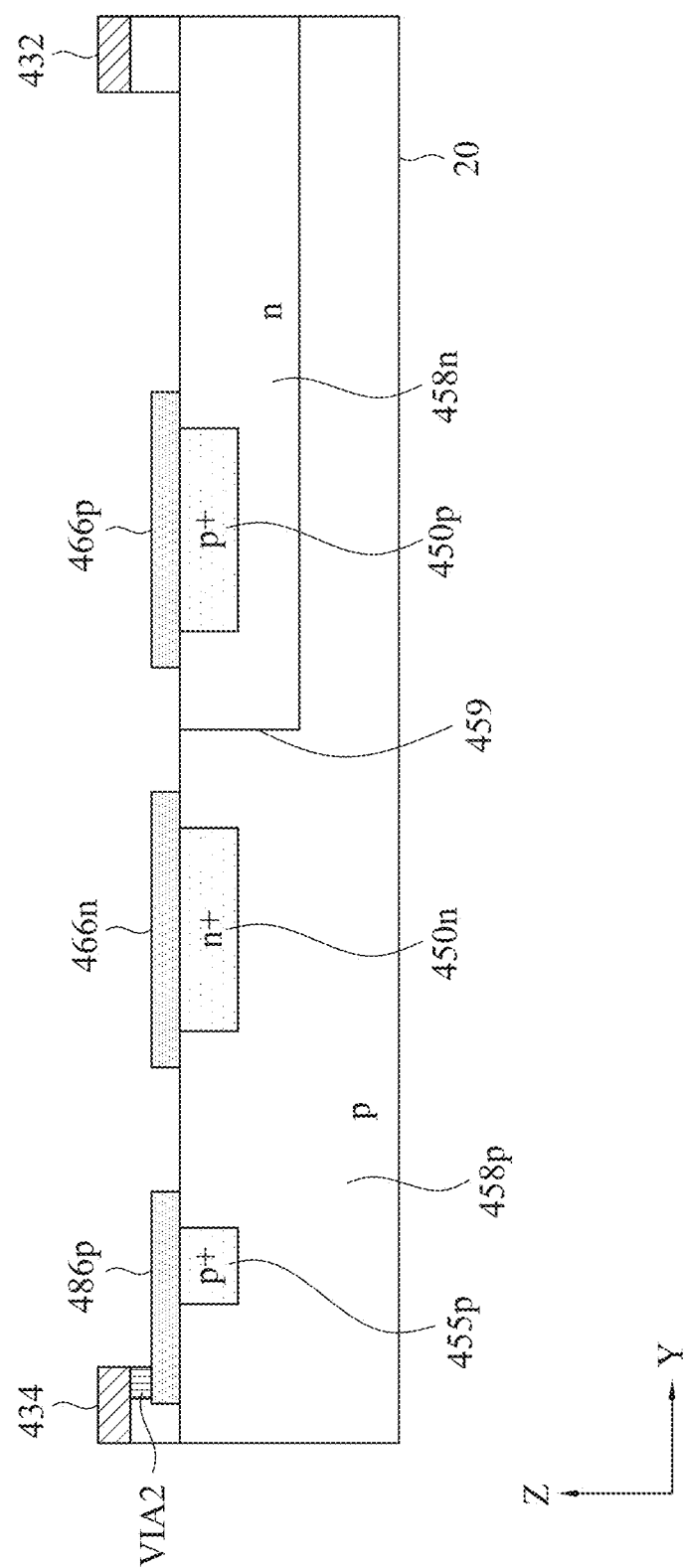
FIG. 4B is a cross-sectional view of the cell along a cut-off plan S-S' in FIG. 4A, in accordance with some embodiments.

FIG. 4B is a cross-sectional view of the cell 400 along a cut-off plan S-S' in FIG. 4A, in accordance with some embodiments. In FIG. 4B, the n-type well 458n is implemented in a p-type substrate 20, the p-type well 458p is provided by a portion of the p-type substrate 20. The p-type active zone 450p and the n-type active zone 450n, in regions near the cut-off plan S-S', are correspondingly provide by p+ diffusion and n+ diffusion. The p-type pick-up region 455p for the lower power pick-up is provide by p+ diffusion. The p-type carrier density in the p-type pick-up region 455p is higher than the p-type carrier density in the p-type well 458p. The well boundary 459 separates the n-type well 458n from the p-type well 458p. In FIG. 4B, the p-type pick-up region 455p is conductively connected to the power rail 434 through a via connection VIA2. In operation, because the p-type pick-up region 455p is maintained at the second supply voltage VSS provided by the power rail 434, the p-type well 458p surrounding the n-type active zone 450n is maintained at the second supply voltage VSS. During normal operation, because the voltage in the n-type active zone 450n is higher than the second supply voltage VSS at the p-type well 458p, leakage currents will not be caused by forward-biased pn junctions between the n-type active zone 450n and the p-type well 458p, and latch-up involving the n-type active zone 450n is prevented.

Figure 5:
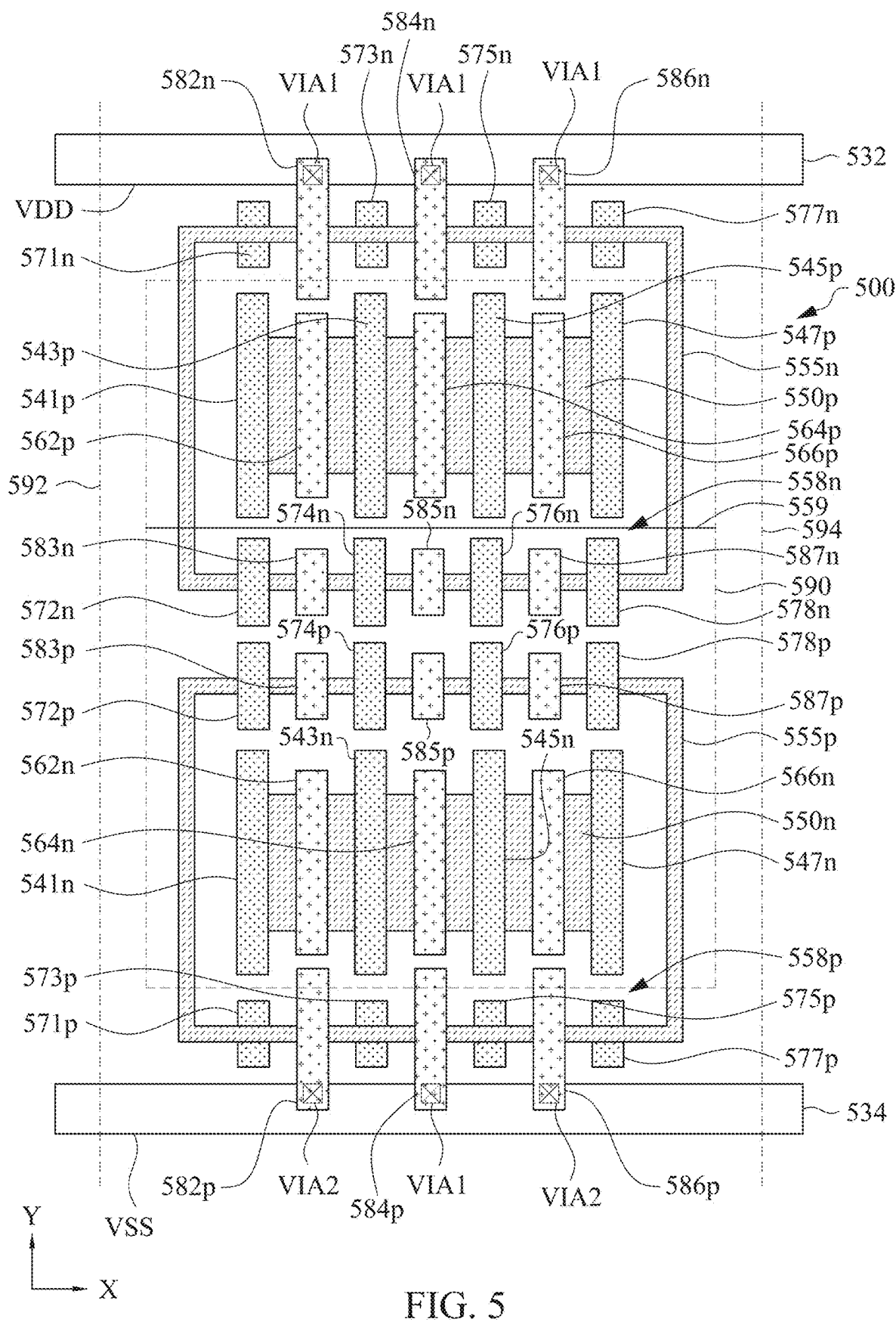
FIG. 5 is a schematic diagram of a cell having guard-rings as pick-up regions, in accordance with some embodiments.

FIG. 5 is a schematic diagram of a cell 500 having guard-rings as pick-up regions, in accordance with some embodiments. In FIG. 5, the cell 500 is between two parallel power rails (e.g., 532 and 534) extending in the X-direction and bounded by two parallel cell boundaries (e.g., 592 and 594) extending in the Y-direction. The power rail 532 is configured to have a first supply voltage VDD, and the power rail 534 is configured to have a second supply voltage VSS. The cell 500 includes an n-type well 558n and a p-type well 558p separated by a well boundary 559. The n-type well 558n occupies at least the area bounded by the cell boundary 592, the well boundary 559, the cell boundaries 594, and the power rail 532. The p-type well 558p occupies at least the area bounded by the cell boundary 592, the well boundary 559, the cell boundaries 594, and the power rail 534.

The cell 500 includes a guard-ring 555n in the n-type well 558n and a guard-ring 555p in the p-type well 558p. The guard-ring 555n is configured to couple the n-type well 558n to the first supply voltage VDD, and the guard-ring 555p is configured to couple the p-type well 558p to the second supply voltage VSS. One or more conductive segments (e.g., 582n, 584n, and 586n) over a first side of the guard-ring 555n conductively connect the guard-ring 555n to the first supply voltage VDD on the power rail 532. One or more conductive segments (e.g., 582p, 584p, and 586p) over a first side of the guard-ring 555p conductively connect the guard-ring 555p to the second supply voltage VSS on the power rail 534.

The cell 500 includes one or more conductive segments (e.g., 583n, 585n, and 587n) over a second side of the guard-ring 555n, and the cell 500 includes one or more conductive segments (e.g., 583p, 585p, and 587p) over a second side of the guard-ring 555p. The cell 500 includes one or more of the gate-strips (e.g., 571n, 573n, 575n, and 577n) over the first side of the guard-ring 555n, and also includes one or more of the gate-strips (e.g., 572n, 574n, 576n, and 578n) over the second side of the guard-ring 555n. The cell 500 includes one or more of the gate-strips (e.g., 571p, 573p, 575p, and 577p) over the first side of the guard-ring 555p, and also includes one or more of the gate-strips (e.g., 572p, 574p, 576p, and 578p) over the second side of the guard-ring 555p. The one or more the gate-strips (e.g., 571n, 573n, 575n, and 577n) over the first side of the guard-ring 555n are either left floating or conductively connected to the first supply voltage VDD. The one or more gate-strips (e.g., 571p, 573p, 575p, and 577p) over the first side of the guard-ring 555p are either left floating or conductively connected to the second supply voltage VS S.

In FIG. 5, the cell 500 includes a p-type active zone 550*p* and an n-type active zone 550*n* extending in the X-direction. The p-type active zone 550*p* is in the n-type well 558*n*, and the n-type active zone 550*n* is in the p-type well 558*p*. The cell 500 includes a circuit 590 that has transistors in the p-type active zone 550*p* and transistors in the n-type active zone 550*n*. In some embodiments, the cell 500 is an analog cell constructed based on the circuit 590. In some embodiments, the transistors in the p-type active zone 550*p* have channel regions formed under the gate-strips (e.g., 541*p*, 543*p*, 545*p*, and 547*p*) intersecting the p-type active zone 550*p*, and in some embodiments, the gate-strips 541*p* and 547*p* are dummy gates. In some embodiments, the transistors in the n-type active zone 550*n* have channel regions formed under the gate-strips (e.g., 541*n*, 543*n*, 545*n*, and 547*n*) intersecting the n-type active zone 550*n*, and in some embodiments, the gate-strips 541*n* and 547*n* are dummy gates. In some embodiments, each of the transistors in the p-type active zone 550*p* has a source or a drain conductively connected to one of the conductive segments (e.g., 562*p*, 564*p*, and 566*p*) intersecting the p-type active zone 550*p*, and each of the transistors in the n-type active zone 550*n* has a source or a drain conductively connected to one of the conductive segments (e.g., 562*n*, 564*n*, and 566*n*) intersecting the n-type active zone 550*n*. In the circuit 590, the transistors in the p-type active zone 550*p* and the transistors in the n-type active zone 550*n* are connected to various electronic components by conductive connections in one or more routing metal layers.

Figure 6:
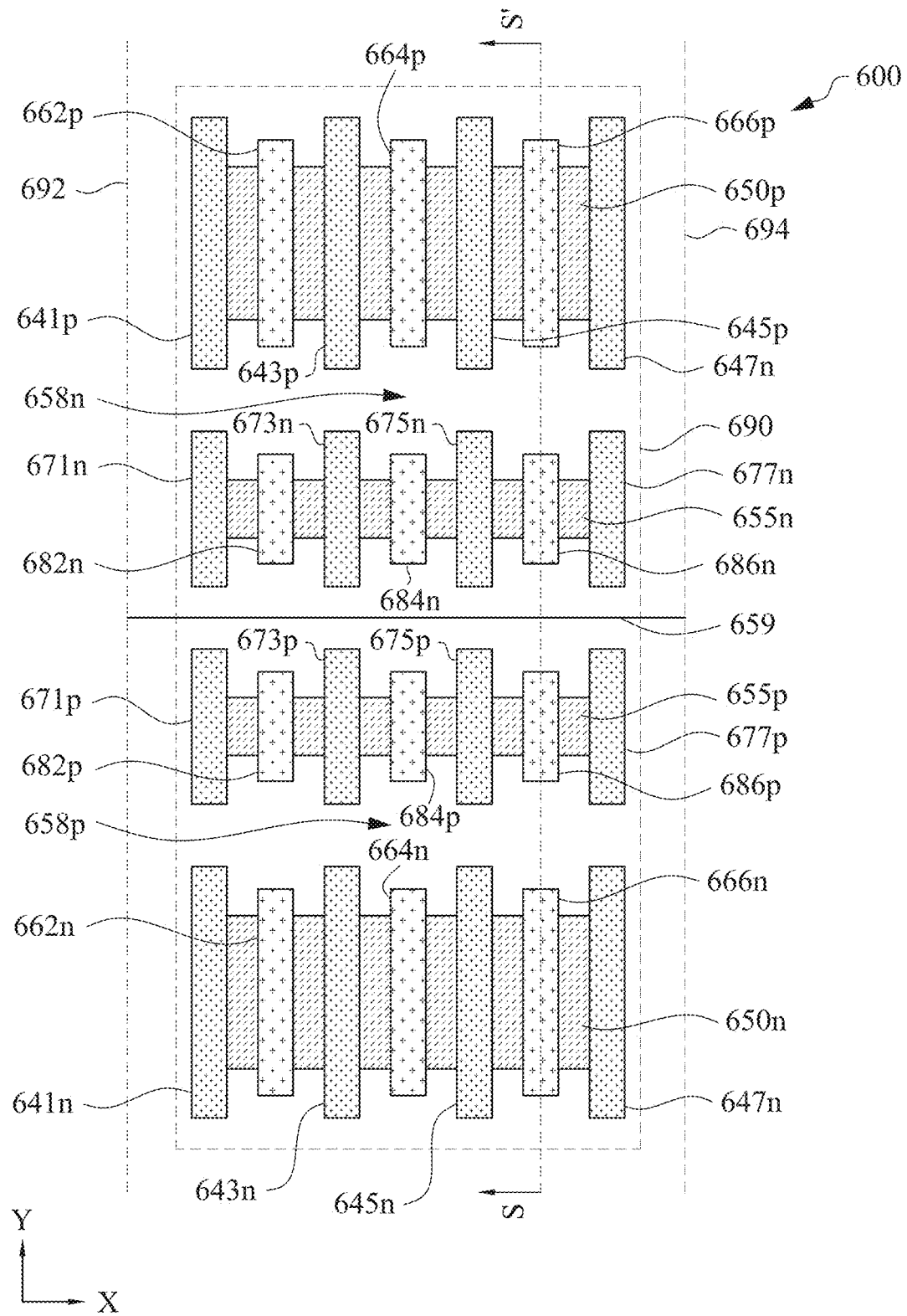
FIG. 6 is a schematic diagram of a portion of a cell having stacked pick-up regions separating two parallel active zones, in accordance with some embodiments.

FIG. 6 is a schematic diagram of a portion of a cell 600 having stacked pick-up regions separating two parallel active zones, in accordance with some embodiments. In FIG. 6, the portion of the cell 600 includes a p-type active zone 650*p* and an n-type active zone 650*n* both extending in the X-direction. The two parallel active zones (e.g., 650*p* and 650*n*) are separated in the Y-direction by an n-type pick-up region 655*n* and a p-type pick-up region 655*p*. The p-type active zone 650*p* is in an n-type well 658*n*, and the n-type active zone 650*n* is in a p-type well 658*p*. The n-type well 658*n* and the p-type well 658*p* are separated by a well boundary 659.

The n-type pick-up region 655*n* is configured to couple the n-type well 658*n* to a first supply voltage VDD. The p-type pick-up region 655*p* is configured to couple the p-type well 658*p* to a second supply voltage VSS. The first supply voltage VDD is higher than the second supply voltage VSS. In some embodiments, one or more conductive segments (e.g., 682*n*, 684*n*, and 686*n*) over the n-type pick-up region 655*n* are connected to the first supply voltage VDD. In some embodiments, one or more conductive segments (e.g., 682*p*, 684*p*, and 686*p*) over the p-type pick-up region 655*p* are connected to the second supply voltage VSS. In some embodiments, the first supply voltage VDD and the second supply voltage VSS are provided by power rails extending in the X-direction in a first metal layer overlying the conductive segments. In some embodiments, the first supply voltage VDD and the second supply voltage VSS are provided by power rails extending in the Y-direction in a second metal layer overlying both the first metal layer and the conductive segments. In some embodiments, the portion of the cell 600 includes one or more of the gate-strips (e.g., 671*n*, 673*n*, 675*n*, and 677*n*), over the n-type pick-up region 655*n*, that are either left floating or connected to the first supply voltage VDD. In some embodiments, the portion of the cell 600 includes one or more of the gate-strips (e.g., 671*p*, 673*p*, 675*n*, and 677*p*), over the p-type pick-up region 655*p*, that are either left floating or connected to the second supply voltage VSS.

In some embodiments, the portion of the cell 600 includes the transistors in the p-type active zone 650*p* and transistors in the n-type active zone 650*n* configured to form a circuit 690. In some embodiments, the cell 600 is an analog cell constructed based on the circuit 690. The transistors in the p-type active zone 650*p* have channel regions under the gate-strips (e.g., 641*p*, 643*p*, 645*p*, and 647*p*) intersecting the p-type active zone 650*p*. The transistors in the n-type active zone 650*n* have channel regions under the gate-strips (e.g., 641*n*, 643*n*, 645*n*, and 647*n*) intersecting the n-type active zone 650. In some embodiments, the gate-strips 641*p* and 647*p* are dummy gates, and in some embodiments, the gate-strips 641*n* and 647*n* are dummy gates. In some embodiments, each of the transistors in the p-type active zone 650*p* has a source or a drain conductively connected to one of the conductive segments (e.g., 662*p*, 664*p*, and 666*p*) intersecting the p-type active zone 650*p*, and each of the transistors in the n-type active zone 650*n* has a source or a drain conductively connected to one of the conductive segments (e.g., 662*n*, 664*n*, and 666*n*) intersecting the n-type active zone 650*n*. In the circuit 690, the transistors in the p-type active zone 650*p* and the transistors in the n-type active zone 650*n* are connected to various electronic components by conductive connections in one or more routing metal layers.

In the embodiments of FIG. 1B, FIG. 3B, and FIG. 4B, the n-type well is formed in a p-type substrate, the p-type well is a portion of the p-type substrate. In some alternative embodiments, the p-type well is formed in an n-type substrate, the n-type well is a portion of the n-type substrate. In still some alternative embodiments, both the n-type well and the p-type well are formed in an insulator substrate.

Figure 7:
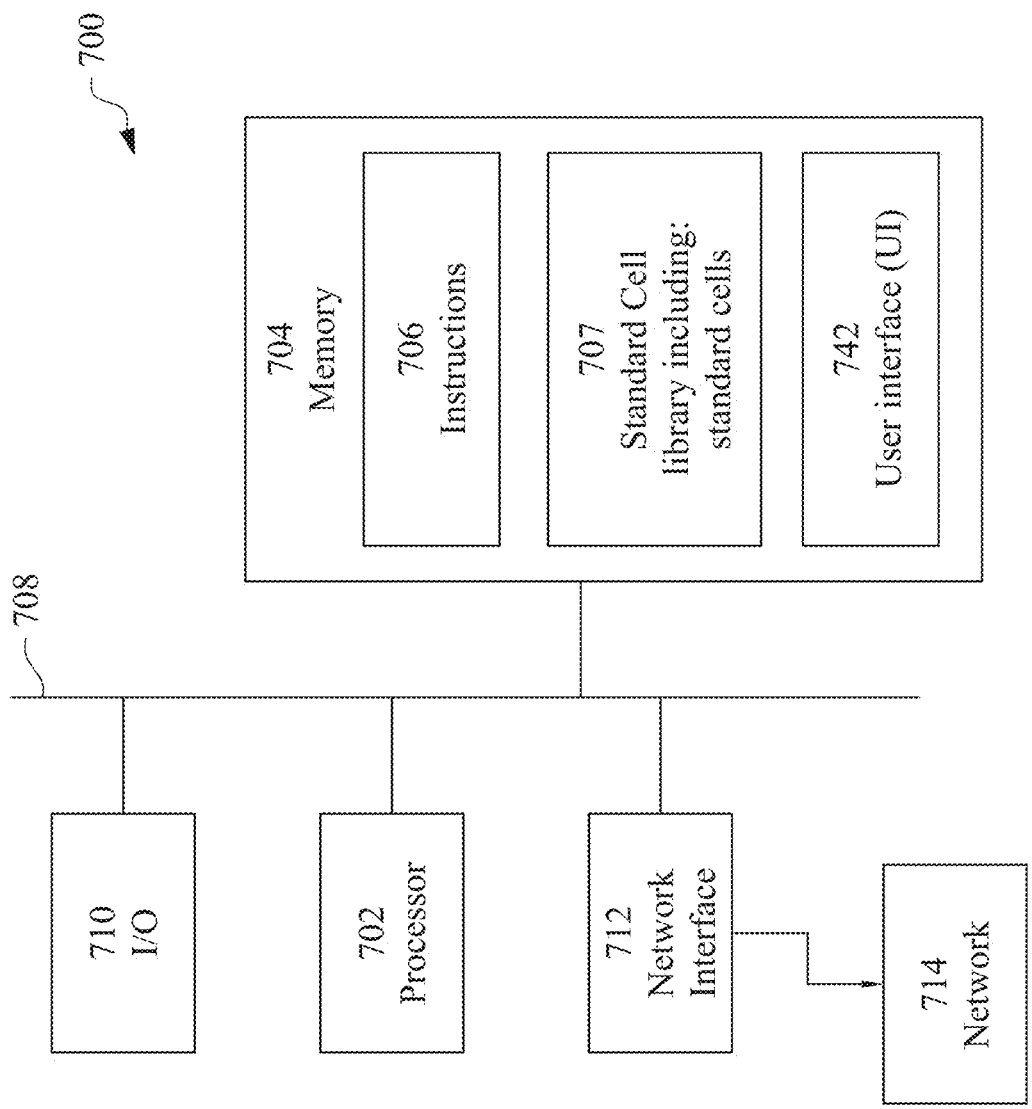
FIG. 7 is a block diagram of an electronic design automation (EDA) system in accordance with some embodiments.

FIG. 7 is a block diagram of an electronic design automation (EDA) system 700 in accordance with some embodiments. In some embodiments, EDA system 700 includes an APR system. Methods described herein of designing layout diagrams represent wire routing arrangements, in accordance with one or more embodiments, are implementable, for example, using EDA system 700, in accordance with some embodiments.

In some embodiments, EDA system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of, e.g., the methods described herein in accordance with one or more embodiments (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause system 700 (where such execution represents (at least in part) the EDA tool) to be usable for performing a portion or all of the noted processes and/or methods. In one or more embodiments, storage medium 704 also stores information which facilitates performing a portion or all of the noted processes and/or methods. In one or more embodiments, storage medium 704 stores library 707 of standard cells including such standard cells as disclosed herein.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
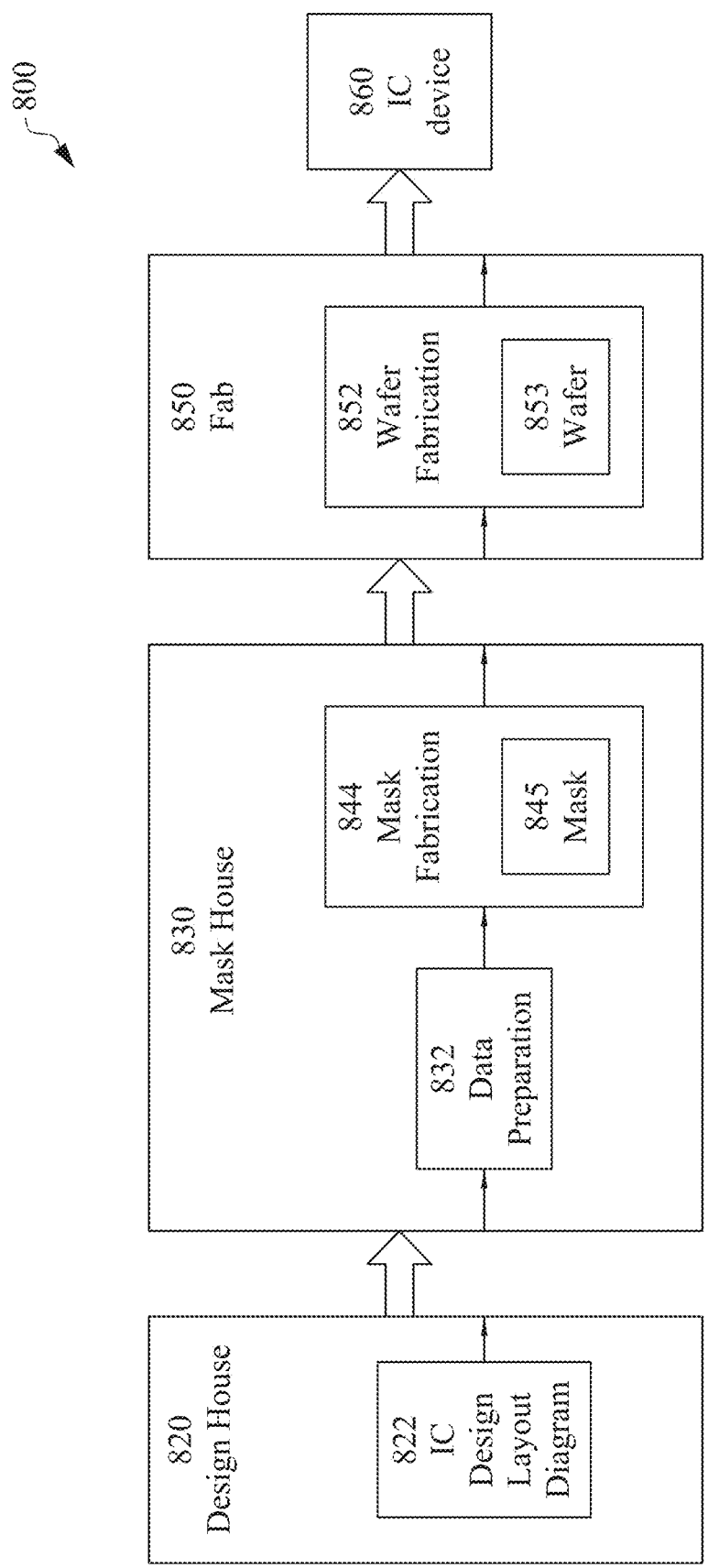
FIG. 8 is a block diagram of an integrated circuit (IC) manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 includes wafer fabrication 852. IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One aspect of this description relates to an integrated circuit. An integrated circuit includes two parallel active zones extending in a first direction, an n-type pick-up region, and a p-type pick-up region. The two parallel active zones includes a p-type active zone located in an n-type well and an n-type active zone located in a p-type well. The n-type pick-up region is located in the n-type well and configured to have a first supply voltage. The p-type pick-up region is located in the p-type well and configured to have a second supply voltage, wherein the second supply voltage is lower than the first supply voltage. The n-type pick-up region and the p-type pick-up region are separated from each other along a direction that is different from the first direction.

Another aspect of this description relates to an integrated circuit. An integrated circuit includes two parallel active zones extending in a first direction, a first power rail extending in the first direction, a second power rail extending in the first direction, and two parallel cell boundaries extending in a second direction perpendicular to the first direction. The two parallel active zones includes a first-type active zone in a second-type well and a second-type active zone in a first-type well. The first power rail is configured to have a first voltage, and the second power rail is configured to have a second voltage. The integrated circuit further includes a first-type pick-up region in the first-type well and between the two parallel cell boundaries. The first-type pick-up region is conductively connected with the first power rail. The first-type pick-up region is separated from the two parallel active zones along a direction that is different from the first direction.

Still another aspect of this description relates to an integrated circuit. An integrated circuit includes two parallel active zones extending in a first direction, a first guard-ring in the n-type well, a second guard-ring in the p-type well, a first power rail extending in the first direction, and a second power rail extending in the first direction. The two parallel active zones includes a p-type active zone located in a n-type well and an n-type active zone located in a p-type well. The first guard-ring surrounds the p-type active zone, and the second guard-ring surrounds the n-type active zone. The first power rail is conductively connected with the first guard-ring, and the second power rail is conductively connected with the second guard-ring.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit comprising:
   two parallel active zones extending in a first direction that includes a p-type active zone located in an n-type well and an n-type active zone located in a p-type well, wherein each of the p-type active zone and the n-type active zone includes a channel region between a source or a drain aligned along the first direction, and wherein the p-type active zone having channel regions is separated from the n-type active zone having channel regions along a second direction that is different from the first direction;
   an n-type pick-up region located in the n-type well;
   a p-type pick-up region located in the p-type well;
   wherein the n-type pick-up region and the p-type pick-up region are separated from each other along the second direction;
   a first power rail extending in the first direction and conductively connected with the n-type pick-up region, and wherein the p-type active zone is between the first power rail and the n-type active zone and separates the first power rail from the n-type active zone;
   wherein the n-type pick-up region has an n-type dopant concentration which is higher than an n-type dopant concentration of the n-type well, and the n-type pick-up region is configured to connect the n-type well conductively to a first supply voltage on the first power rail;
   a first conductive segment extending in the second direction and in conductive contact with the n-type pick-up region;
   a first via connection connected between the first power rail and the first conductive segment;
   a second power rail extending in the first direction and conductively connected with the p-type pick-up region, and wherein the n-type active zone is between the second power rail from the p-type active zone and separates the second power rail from the p-type active zone;
   wherein the p-type pick-up region has a p-type dopant concentration which is higher than a p-type dopant concentration of the p-type well, and the p-type pick-up region is configured to connect the p-type well conductively to a second supply voltage on the second power rail;
   a second conductive segment extending in the second direction and in conductive contact with the p-type pick-up region; and
   a second via connection connected between the second power rail and the second conductive segment.

2. The integrated circuit of claim 1, wherein the n-type pick-up region is between the first power rail and the p-type active zone and separates the first power rail from the p-type active zone.

3. The integrated circuit of claim 1, wherein the p-type pick-up region is between the second power rail and the n-type active zone and separates the second power rail from the n-type active zone.

4. The integrated circuit of claim 1, wherein the n-type pick-up region is separated from the p-type pick-up region by the two parallel active zones.

5. The integrated circuit of claim 1, wherein the two parallel active zones are separated in by the n-type pick-up region and the p-type pick-up region.

6. The integrated circuit of claim 1, wherein an n-type carrier density in the n-type pick-up region is higher than the n-type carrier density in the n-type well, and a p-type carrier density in the p-type pick-up region is higher than the p-type carrier density in the p-type well.

7. The integrated circuit of claim 1, wherein the n-type pick-up region has a width extending in the first direction and has a height extending in the second direction, and wherein the height is less than 25% of the width.

8. The integrated circuit of claim 1, wherein the p-type pick-up region has a width extending in the first direction and has a height extending in the second direction, and wherein the height is less than 25% of the width.

9. The integrated circuit of claim 1, wherein the p-type well is a part of a p-type substrate and the n-type well is formed in the p-type substrate.

10. The integrated circuit of claim 1, wherein the n-type well is a part of a n-type substrate and the p-type well is formed in the n-type substrate.

11. The integrated circuit of claim 1, further comprising:
    an analog cell including a circuit having transistors in the p-type active zone and the n-type active zone.

12. An integrated circuit comprising:
    two parallel active zones extending in a first direction that includes a first-type active zone in a second-type well and a second-type active zone in a first-type well, wherein each of the first-type active zone and the second-type active zone includes a channel region between a source or a drain aligned along the first direction, and wherein the first-type active zone having channel regions is separated from the second-type active zone having channel regions along a second direction that is perpendicular to the first direction;

a first power rail extending in the first direction and configured to have a first voltage, and wherein the first-type active zone is between the first power rail and the second-type active zone and separates the first power rail from the second-type active zone;

a second power rail extending in the first direction and configured to have a second voltage, and wherein the second-type active zone is between the second power rail from the first-type active zone and separates the second power rail from the first-type active zone;

two parallel cell boundaries extending in the second direction;

a first-type pick-up region, in the first-type well and between the two parallel cell boundaries, conductively connected with the first power rail;

wherein the first-type pick-up region has a first-type dopant concentration which is higher than a first-type dopant concentration of the first-type well, and the first-type pick-up region is configured to connect the first-type well conductively to the first voltage on the first power rail;

a first conductive segment extending in the second direction and in conductive contact with the first-type pick-up region;

a first via connection connected between the first power rail and the first conductive segment; and wherein the first-type pick-up region is separated from the two parallel active zones along a direction that is different from the first direction.

13. The integrated circuit of claim 12, further comprising:
a second-type pick-up region, in the second-type well and between the two parallel cell boundaries, conductively connected to the second power rail;
a second conductive segment extending in the second direction and in conductive contact with the second-type pick-up region; and
a second via connection connected between the second power rail and the second conductive segment.

14. The integrated circuit of claim 12, wherein the first-type well is n-type and the second-type well is p-type, and wherein the first voltage is a first supply voltage and the second voltage is a second supply voltage is lower than the first supply voltage.

15. The integrated circuit of claim 12, wherein the first-type well is p-type and the second-type well is n-type, and wherein the second voltage is a first supply voltage and the first voltage is a second supply voltage is lower than the first supply voltage.

16. The integrated circuit of claim 12, further comprising:
an analog cell including a circuit having transistors in the first-type active zone and the second-type active zone.

17. An integrated circuit comprising:
two parallel active zones extending in a first direction that includes a p-type active zone located in an n-type well and an n-type active zone located in a p-type well, wherein each of the p-type active zone and the n-type active zone includes a channel region between a source or a drain aligned along the first direction, and wherein the p-type active zone having channel regions is separated from the n-type active zone having channel regions along a second direction that is different from the first direction;

an n-type pick-up region, in the n-type well, forming a first guard-ring surrounding the p-type active zone;

a p-type pick-up region, in the p-type well, forming a second guard-ring surrounding the n-type active zone;

wherein the n-type pick-up region and the p-type pick-up region are separated from each other along the second direction;

a first power rail extending in the first direction and conductively connected with the n-type pick-up region, and wherein the p-type active zone is between the first power rail and the n-type active zone and separates the first power rail from the n-type active zone;

wherein the n-type pick-up region has an n-type dopant concentration which is higher than an n-type dopant concentration of the n-type well, and the n-type pick-up region is configured to connect the n-type well conductively to a first supply voltage on the first power rail;

a first conductive segment extending in the second direction and in conductive contact with the n-type pick-up region;

a first via connection connected between the first power rail and the first conductive segment;

a second power rail extending in the first direction and conductively connected with the p-type pick-up region, and wherein the n-type active zone is between the second power rail from the p-type active zone and separates the second power rail from the p-type active zone;

wherein the p-type pick-up region has an p-type dopant concentration which is higher than an p-type dopant concentration of the p-type well, and the p-type pick-up region is configured to connect the p-type well conductively to a second supply voltage on the second power rail;

a second conductive segment extending in the second direction and in conductive contact with the p-type pick-up region; and a second via connection connected between the second power rail and the second conductive segment.

18. The integrated circuit of claim 17, wherein the n-type pick-up region is configured to have a first supply voltage, and the p-type pick-up region is configured to have a second supply voltage which is lower than the first supply voltage.

19. The integrated circuit of claim 17, wherein the p-type well is a part of a p-type substrate and the n-type well is formed in the p-type substrate.

20. The integrated circuit of claim 17, wherein the n-type well is a part of an n-type substrate and the p-type well is formed in the n-type substrate.

* * * * *